(12) United States Patent
Ko et al.

(10) Patent No.: US 9,076,802 B1
(45) Date of Patent: Jul. 7, 2015

(54) DUAL-SIDED FILM-ASSIST MOLDING PROCESS

(71) Applicants: WonJun Ko, Sungnam-Si (KP); GwangTae Kim, Seoul (KR); KeoChang Lee, Icheon-si (KR)

(72) Inventors: WonJun Ko, Sungnam-Si (KP); GwangTae Kim, Seoul (KR); KeoChang Lee, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 111 days.

(21) Appl. No.: 14/037,320

(22) Filed: Sep. 25, 2013

(51) Int. Cl.
*H01L 23/28* (2006.01)
*H01L 21/00* (2006.01)
*H01L 21/56* (2006.01)

(52) U.S. Cl.
CPC ...................................... *H01L 21/56* (2013.01)

(58) Field of Classification Search
CPC ....................................................... H01L 21/56
See application file for complete search history.

(56) References Cited

U.S. PATENT DOCUMENTS

| | | |
|---|---|---|
| 5,955,115 A | 9/1999 | Bolanos et al. |
| 7,029,947 B2 | 4/2006 | Joshi |
| 7,465,368 B2 | 12/2008 | Lim et al. |
| 7,829,004 B2 | 11/2010 | Ho et al. |
| 7,993,978 B2 | 8/2011 | Sato |
| 8,497,585 B2 | 7/2013 | Lee |
| 2004/0012077 A1 | 1/2004 | Ibrahim et al. |
| 2004/0113281 A1* | 6/2004 | Brandenburg et al. ....... 257/778 |

\* cited by examiner

*Primary Examiner* — Stephen W Smoot
*Assistant Examiner* — Vicki B Booker (57) ABSTRACT

Simultaneous semiconductor packages can be produced using a dual-sided film-assist molding process. The process involves using a film or membrane having opposing surfaces for receiving un-encapsulated semiconductor packages on both surfaces. A slot can be formed in the film or membrane to facilitate introduction and passage of the encapsulation therethrough such that upon removal of the film or membrane, increased throughput and productivity of the completed semiconductor packages can be carried out to achieve considerable cost savings.

18 Claims, 6 Drawing Sheets

DUAL-SIDED FILM-ASSIST MOLDING PROCESS

TECHNICAL FIELD

The present disclosure relates in general to semiconductor processing and, more particularly, to methods of manufacturing simultaneous semiconductor packages with a dual-sided film-assist molding process.

BACKGROUND

Electronic products have become an integral part of our daily lives. Packages of components such as semiconductor circuits, transistors, diodes, and other electronic devices have become smaller and thinner with more functions and connections. In packaging components, the need for coupling components together in a reliable manner can influence the manufacturing processes.

In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

SUMMARY

Simultaneous semiconductor packages can be produced using a dual-sided film-assist molding process. The process involves using a film or membrane having opposing surfaces for receiving un-encapsulated semiconductor packages on both surfaces. A slot can be formed in the film or membrane to facilitate introduction and passage of the encapsulation therethrough such that upon removal of the film or membrane, increased throughput and productivity of the completed semiconductor packages can be carried out to achieve considerable cost savings.

In one embodiment, a method of producing a semiconductor package includes step (a) of providing a membrane having a first surface and a second surface, where the second surface is opposite the first surface. Step (b) includes providing a first package having a first substrate, and providing a second package having a second substrate. Next, step (c) involves creating a first cavity between the first surface and the first substrate, and creating a second cavity between the second surface and the second substrate. Step (d) entails forming a slot in the membrane, where the slot extends from the first surface to the second surface and through the membrane. Finally, in this embodiment, the last step (e) includes forming, concomitantly, an encapsulation on the first package and on the second package by introducing the encapsulation through the slot to simultaneously encapsulate the first cavity and the second cavity.

In another embodiment, the method further includes step (f) of removing the membrane to produce the first package and the second package, where each of the first package and the second package has the same encapsulation resulting from the simultaneous forming step (e).

In some embodiments, the providing step (b) includes producing the first package having a first integrated circuit device mounted on the first substrate, and where the creating step (c) further includes contacting the first surface to an upper surface of the first integrated circuit device such that the first cavity is adjacent the first integrated circuit device. In other embodiments, the providing step (b) includes producing the second package having a second integrated circuit device mounted on the second substrate, and where the creating step (c) further includes contacting the second surface to an upper surface of the second integrated circuit device such that the second cavity is adjacent the second integrated circuit device.

In one embodiment, before the creating step (c) and after the providing step (b), there may be a supporting step of supporting the first package with a first support structure contacting the first substrate. In another embodiment, before the creating step (c) and after the providing step (b), there may be a supporting step of supporting the second package with a second support structure contacting the second substrate. In yet another embodiment, the providing step (a) further includes configuring a first film on the first surface of the membrane, and configuring a second film on the second surface of the membrane. Doing so allows the first cavity to be created between the first film and the first substrate, and the second cavity to be created between the second film and the second substrate, during the creating step (c).

In one embodiment, a method of producing a semiconductor package includes step (a) of providing a membrane having a first surface and a second surface, where the second surface is opposite the first surface. Step (b) involves providing a first package having a first substrate with a first integrated circuit device mounted thereon, and providing a second package having a second substrate with a second integrated circuit device mounted thereon. Next, step (c) involves contacting the first surface to an upper surface of the first integrated circuit device to create a first cavity between the first surface and the first substrate, where the first cavity is adjacent the first integrated circuit device. This step also includes contacting the second surface to an upper surface of the second integrated circuit device to create a second cavity between the second surface and the second substrate, the second cavity adjacent the second integrated circuit device. Subsequently, step (d) includes forming a slot in the membrane where the slot extends from the first surface to the second surface through the membrane. In this embodiment, the final step (e) involves forming, concomitantly, an encapsulation on the first package and on the second package by introducing the encapsulation through the slot to simultaneously encapsulate the first cavity and the second cavity.

In one embodiment, the method further includes step (f) of removing the membrane to produce the first package and the second package, where each of the first package and the second package includes the same encapsulation resulting from the simultaneous forming step (e).

In some embodiments, before the contacting step (c) and after the providing step (b), the method includes supporting the first package with a first support structure contacting the first substrate. In other embodiments, before the contacting step (c) and after the providing step (b), the method includes supporting the second package with a second support struc- ture contacting the second substrate.

In some embodiments, the providing step (a) further includes configuring a first film on the first surface of the membrane, and configuring a second film on the second surface of the membrane. Doing so facilitates contacting of the first film on the first surface to the upper surface of the first integrated circuit device, and contacting of the second film on the second surface to the upper surface of the second integrated circuit device, during the contacting step (c).

In other embodiments, the contacting step (c) includes contacting the first film on the first surface to the upper surface of the first integrated circuit device to create the first cavity between the first film and the first substrate, where the first cavity is adjacent the first integrated circuit device. This contacting step (c) also includes contacting the second film on the second surface to the upper surface of the second integrated circuit device to create the second cavity between the second film and the second substrate, where the second cavity is adjacent the second integrated circuit device.

In one embodiment, a method of producing a semiconductor package includes step (a) of providing a membrane having a first surface and a second surface that is opposite the first surface. In this instance, the first surface includes a first film mounted thereon, and the second surface includes a second film mounted thereon. Next, step (b) involves providing a first package having a first substrate and providing a second package having a second substrate. Subsequently, step (c) includes creating a first cavity by contacting the first film to the first package, and creating a second cavity by contacting the second film to the second package. Next, step (d) involves forming of a slot in the membrane, where the slot extends from the first surface to the second surface and through the membrane. Next, step (e) includes forming, concomitantly, an encapsulation on the first package and on the second package by introducing the encapsulation through the slot to simultaneously encapsulate the first cavity and the second cavity. Last but not least, in this embodiment, step (f) includes removing the membrane to produce the first package and the second package, where each of the first package and the second package has the same encapsulation resulting from the simultaneous forming step (e).

In some embodiments, the providing step (b) includes providing the first package having a first integrated circuit device mounted on the first substrate, and the creating step (c) includes contacting the first film to an upper surface of the first integrated circuit device such that the first cavity is adjacent the first integrated circuit device. In other embodiments, the providing step (b) includes providing the second package having a second integrated circuit device mounted on the second substrate, and the creating step (c) includes contacting the second film to an upper surface of the second integrated circuit device such that the second cavity is adjacent the second integrated circuit device.

In some embodiments, before the creating step (c) and after the providing step (b), includes a supporting step of supporting the first package with a first support structure contacting the first substrate. In other embodiments, before the creating step (c) and after the providing step (b), includes a supporting step of supporting the second package with a second support structure contacting the second substrate.

Other variations, embodiments and features of the present disclosure will become evident from the following detailed description, drawings and claims.

DETAILED DESCRIPTION OF THE DISCLOSURE

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

Figure 1A:
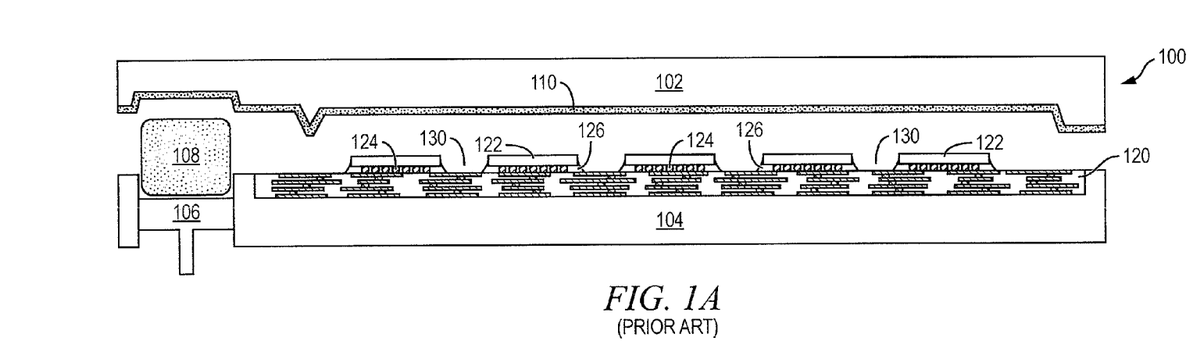
FIGS. 1A-1C are cross-sectional views of a process flow for manufacturing a semiconductor package using a conventional film-assist molding process.
Figures 1B, 1C:
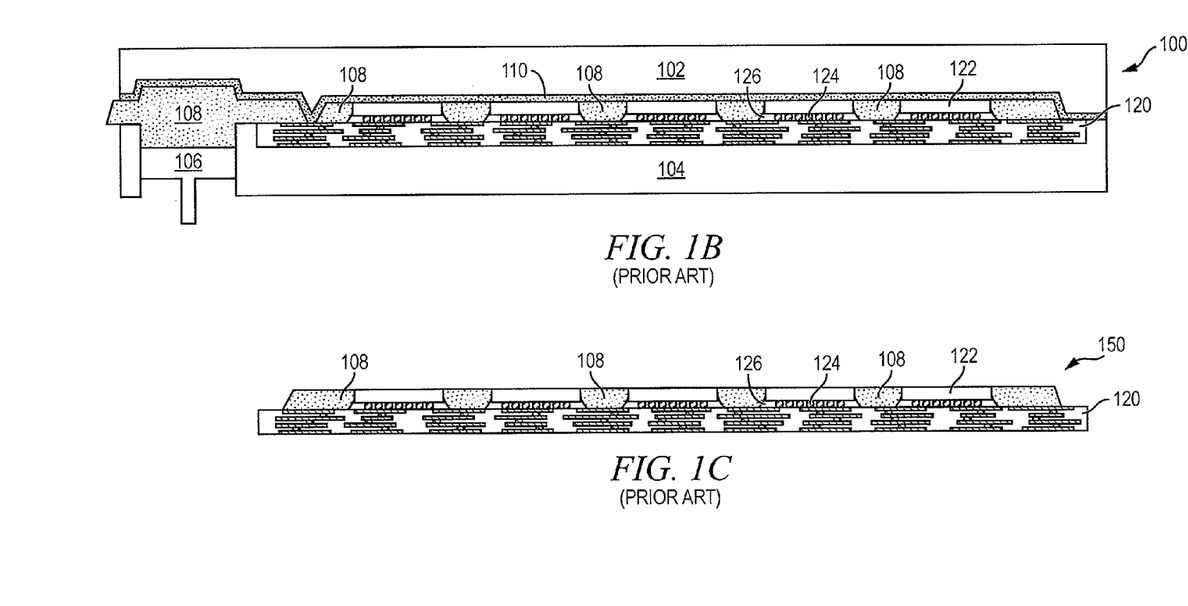

FIGS. 1A-1C are cross-sectional views of a process flow 100 for manufacturing a semiconductor package 150 using a film-assist molding process known in the art. In this instance, the semiconductor package starts out as an un-encapsulated package as best illustrated in FIG. 1A. The semiconductor package includes a substrate 120, which can be a laminate substrate, a printed circuit board (PCB), a silicon substrate, an organic substrate, a ceramic substrate, a plastic substrate, a package carrier, or some other laminated or flexible structure for redistribution of signals. In some embodiments, the substrate 120 can be an interposer, or a redistribution layer or material, among other suitable semiconductor substrates.

A plurality of integrated circuit devices 122 can be formed on an upper surface of the substrate 120, the integrated circuit device 122 being a flip chip, a wire-bond chip or other suitable semiconductor device. In some embodiments, other types of integrated circuit devices 122 including logic, memory, passives, among others, can also be included. The integrated circuit device 122 can be mounted on the substrate 120 via device interconnects 124 surrounded by an underfill 126 such as a molding compound or an encapsulation. The device interconnects 124 may be solder bumps, solder balls, copper pillars, copper balls, among others. The process of forming the underfill 126 can be carried out using film-assisted molding, epoxy molding, moldable underfill or other protective molding process. The underfill 126 can protect the integrated circuit device 122 as well as the device interconnects 124 from moisture, dust and other contaminants. Alternatively, instead of device interconnects 124 and underfill 126 the integrated circuit device 122 can be attached to the substrate 120 via an adhesive material (not shown). In another example, the underfill 126 may be optional thereby leaving the integrated circuit device 122 as well as the device interconnects 124 substantially exposed.

In operation, FIG. 1A is a cross-sectional view of a semiconductor package in preparation for a molding process. The substrate 120 can be received or supported by a support structure such as a bottom mold chase 104. The bottom mold chase 104 can be coupled to a top mold chase 102 in preparation for an injection molding process with a molding material 108, which can have similar materials properties as that of the underfill 126 and be introduced in similar fashion and process. In one embodiment, the molding process incorporates the use of a buffer layer or film 110, which can be coupled to the top mold chase 104. The use of buffer layers (e.g., plastic films) in the mold chase 102 can facilitate the removal of the package from the mold 102, 104. It can also keep the molding surfaces relatively clear of molding compounds 108 for ease of cleaning and processing repetition. Additional details and benefits on film-assist molding process are disclosed in U.S. Pat. No. 8,035,235 granted Oct. 11, 2011 and filed as U.S.

patent application Ser. No. 12/560,312 on Sep. 15, 2009, which is hereby incorporated by reference in its entirety for all purposes.

In operation, once the top mold chase 102 and the bottom mold chase 104 are brought into contact, cavities 130 can be formed between the film 110 and the upper surface of the substrate 120. These cavities 130 are also adjacent the plurality of integrated circuit device 122. The molding compound 108 can be introduced via a plunger 106 from a side of the molding process through a gate. The molding material 108 can be liquefied first by heat and pressure, and be allowed to flow into and fill the enclosed cavities 130. Ideally, the cavities 130 should be filled without any voids and/or defects as best illustrated in FIG. 1B. Eventually the molding compound 108 can be subjected to additional heat and pressure until the material is solidified or cured. The mold 102, 104 can subsequently be de-coupled from one another to release the completed, encapsulated semiconductor package 150 as best shown in FIG. 1C. In this example, the substrate 120 of the semiconductor package 150 includes a plurality of integrated circuits 122 mounted thereon and protected by the encapsulation or molding compound 108.

Although the process as described above is able to produce a completed, encapsulated semiconductor package with film-assist molding, the process nevertheless needs to be repeated and is able to produce only one set of encapsulated semiconductor package 150 with each process cycle. Accordingly, there is a need to increase productivity and throughput with a dual-sided film-assist molding process, which not only leads to decreased cost but also increased productivity and productability.

FIGS. 2A-2D are cross-sectional views of a process flow 200 for manufacturing a semiconductor package 250 using a dual-sided film-assist molding process according to one embodiment of the present disclosure. In one embodiment, the process includes a film or membrane 210 having a first surface 210a and a second surface 210b. The second surface 210b can be opposite the first surface 210a. A first package 270a having a first substrate 220a and a second package 270b having a second substrate 220b can be provided and introduced to the process flow as best illustrate in FIG. 2A. Each package 270 includes a plurality of integrated circuit devices 222a, 222b formed on their respective substrate surfaces 220a, 220b, each device in electrical connection to the substrate via device interconnects 224 with corresponding underfill materials 226. The substrates 220, integrated circuit devices 222, device interconnects 224 and underfill 226 may be formed in similar fashion and have similar material properties as those discussed above and will not be elaborated further herein.

Figure 2A:
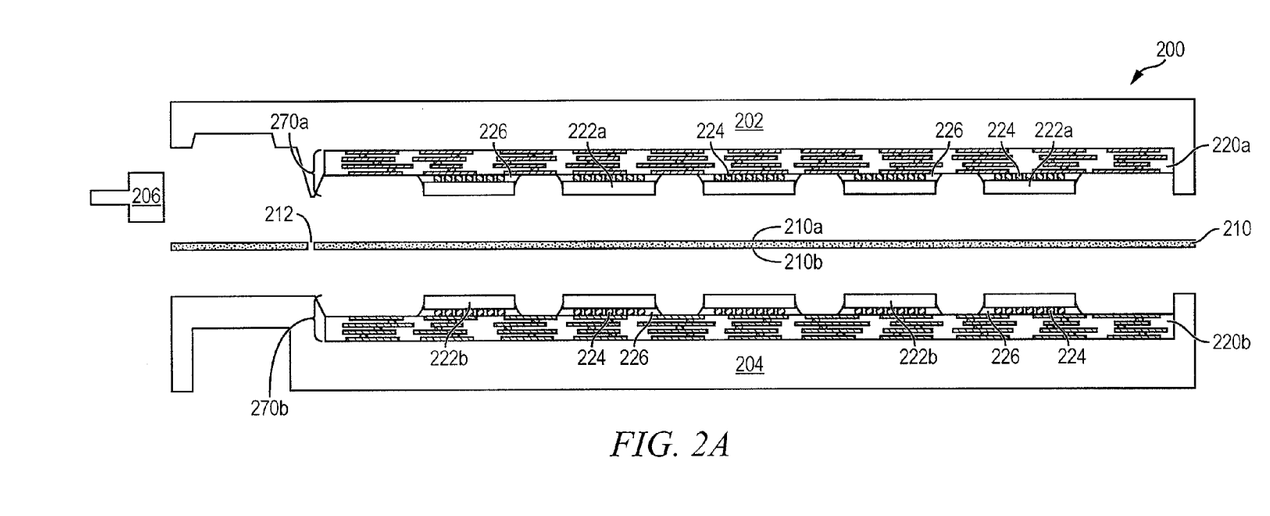
FIGS. 2A-2D are cross-sectional views of a process flow for manufacturing a semiconductor package using a dual-sided film-assist molding process according to one embodiment of the present disclosure.

In one embodiment, the first package 270a can be supported by a first support structure 202. More specifically, the first substrate 220a of the first package 270a can be supported or brought into physical contact with a first support structure 202 such as a top mold chase. Likewise, the second package 270b can be supported by a second support structure 204. More specifically, the second substrate 220b of the second package 270b can be supported or brought into physical contact with a second support structure 204 such as a bottom mold chase. The support structures 202, 204 and their relationship to the substrates 220 and the packages 270 are best illustrated in the figure.

In one embodiment, a section of the membrane 210 includes an aperture or slot 212 formed in the membrane thereof. The slot 212 can be formed off to one side or one end of the membrane 210, the slot 212 extending from the first surface 210a to the second surface 210b and through the thickness of the membrane 210. The slot 212 will be used in the dual-sided film-assist molding process as will be further elaborated below. Specifically, the slot 212 will allow the molding compound 208 to flow freely into either of the packages 270. The membrane 210 together with the packages 270 are now ready to engage and receive a molding compound as to be delivered via a plunger 206.

Figure 2B:
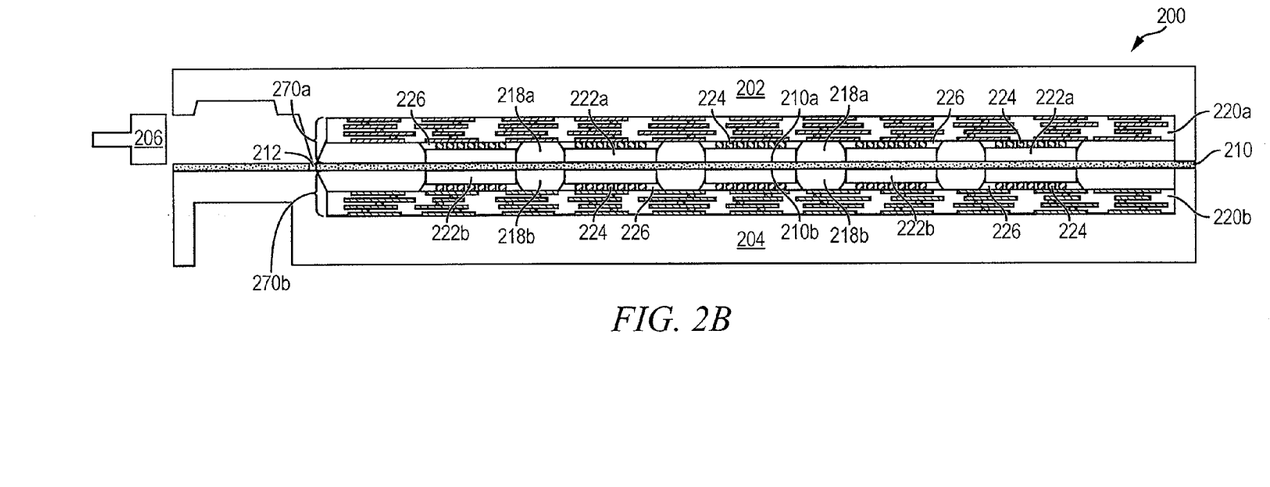

FIG. 2B shows the next step of the process where a first cavity 218a can be created between the first surface 210a of the membrane 210 and the first substrate 220a of the first package 270a while a second cavity 218b can be created between the second surface 210b of the membrane 210 and the second substrate 220b of the second package 270b.

The first cavity 218a is created when the first surface 210a of the membrane 210 is brought into contact with an upper surface of the first integrated circuit device 222a such that the first cavity 218a is adjacent the first integrated circuit device 222a. The first cavity 218a includes not only the area surrounding the first integrated circuit device 222a but also the open spaces and adjacent areas between the first surface 210a of the membrane 210 and the first substrate 220a of the first package 270a.

Similarly, the second cavity 218b is created when the second surface 210b of the membrane 210 is brought into contact with an upper surface of the second integrated circuit device 222b such that the second cavity 218b is adjacent the second integrated circuit device 222b. The second cavity 218b includes not only the area surrounding the second integrated circuit device 222b but also the open spaces and adjacent areas between the second surface 210b of the membrane 210 and the second substrate 220b of the second package 270b.

Figure 2C:
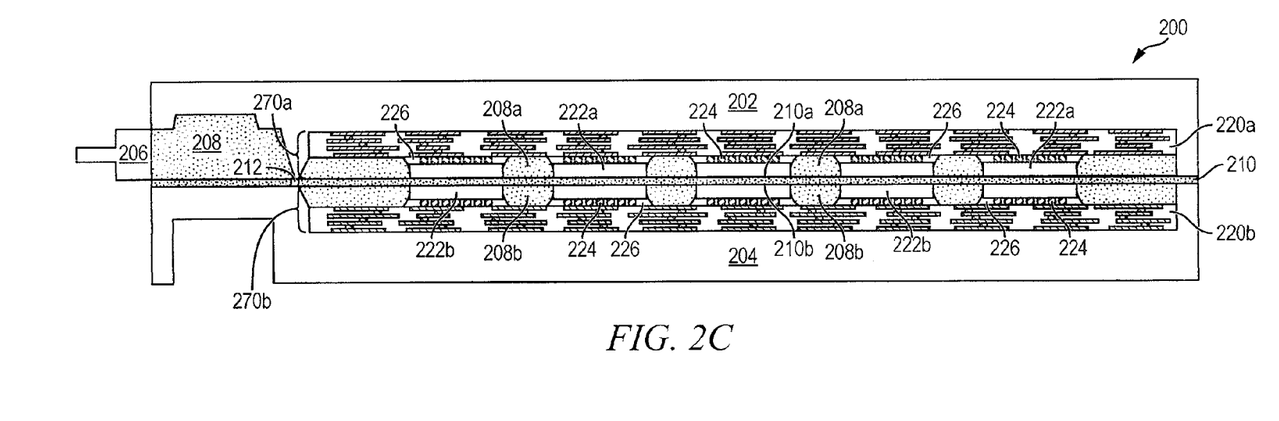

FIG. 2C shows the next step of the process flow where a molding material 208 is introduced into the packages 270a, 270b. In one embodiment, the encapsulation or molding compound 208 can be introduced via the plunger 206 from one side of the system through the slot 212 to simultaneously encapsulate and protect the first package 270a and the second package 270b. More specifically, the encapsulation introduced into the system can encapsulate both the first cavity 208a and the second cavity 208b. As can be seen in the figure, the encapsulation or molding compound 208 for encapsulating or protecting both the packages 270 can come from the same batch of molding compound 208. Additionally, the encapsulation or molding compound 208 for both packages 270 can be formed concomitantly or simultaneously. In other words, the encapsulation for both packages 270 can be formed at the same time.

Figure 2D:
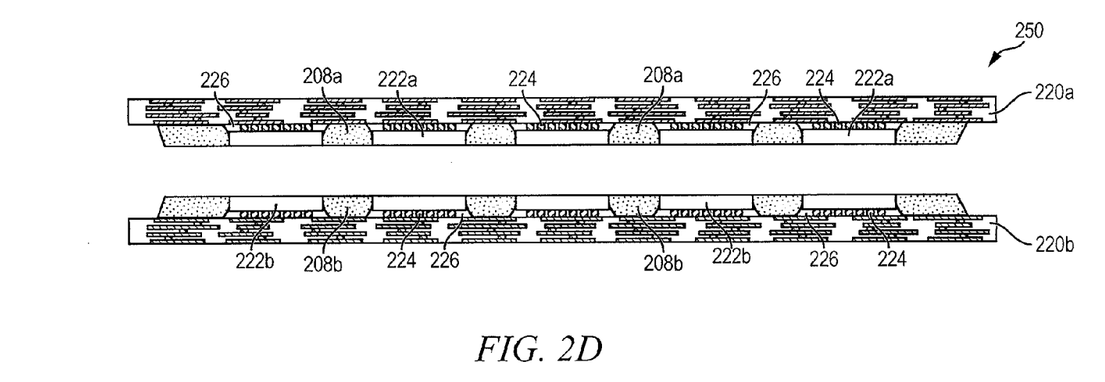

Subsequently, after the molding compound 208 has had sufficient heat and/or time to flow freely throughout the cavities 218, the molding compound 208 may be cured and the membrane 210 can be decoupled or removed to produce completed, encapsulated packages 250 as best illustrated in FIG. 2D. In this embodiment, a first completed package includes the first substrate 220a having a plurality of integrated circuit devices 220a mounted thereon, the integrated circuit devices 220a encapsulated with a molding compound 208a. Similarly, a second completed package includes the second substrate 220b having a plurality of integrated circuit devices 220b mounted thereon, the integrated circuit devices 220b encapsulated with a molding compound 208b. The currently disclosed embodiment is able to complete two packages 250 concurrently or simultaneously at the same time in contrast to a conventional process where only one such package can be produced thereby increasing the throughput by two-fold. Furthermore, the first package and the second package each includes the same encapsulation or molding compound 208 from the simultaneous forming step as discussed above.

Figure 3:
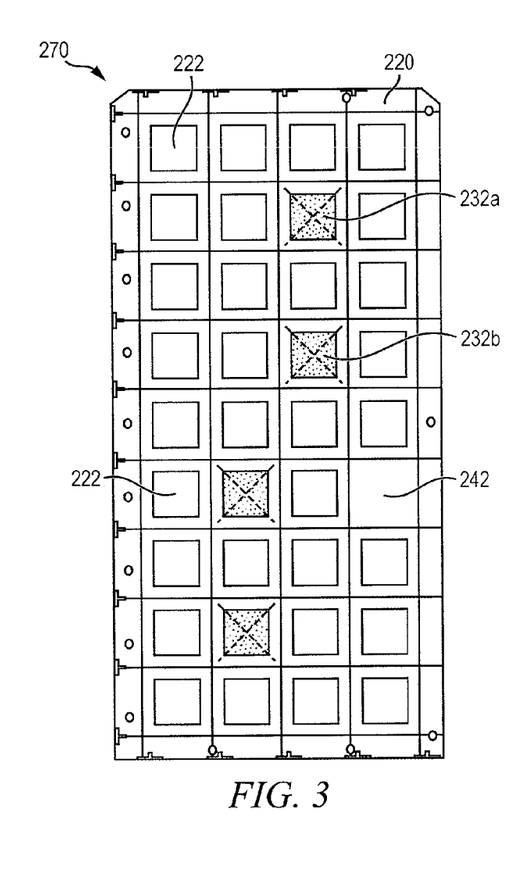
FIG. 3 is a top plan view of a semiconductor package.

FIG. 3 is a top plan view of a semiconductor package 270 prior to an encapsulation or molding step. The package 270 includes a substrate 220 as described above having a plurality of integrated circuit device 222 formed thereon. In this instance, certain portions of the substrate 220 may include cross-out units 232a or silicon dummy units 232b. In other instances, certain portions of the substrate 220 may be open 242.

Figure 4A:
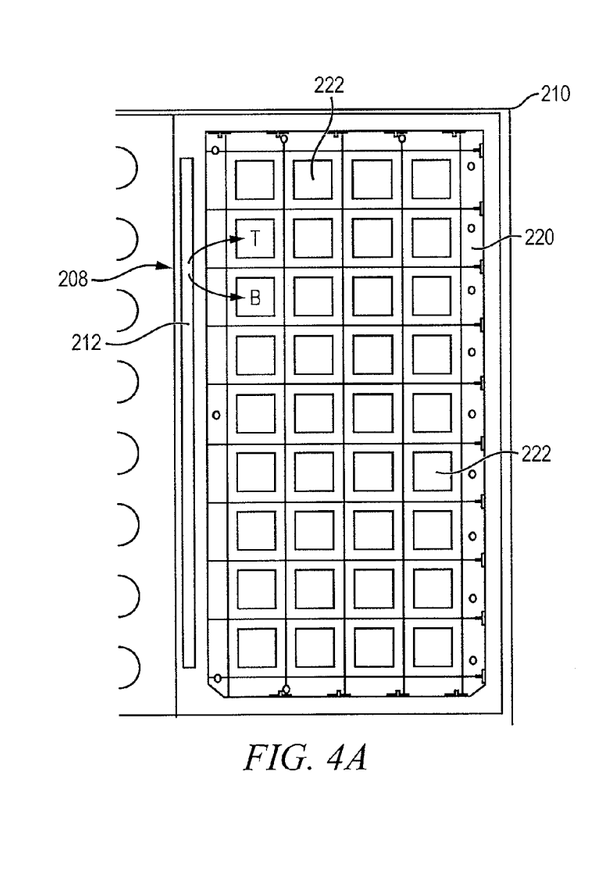
FIGS. 4A-4B are top plan and cross-sectional views of the dual-sided film-assist molding process of FIGS. 2A-2D.
Figure 4B:
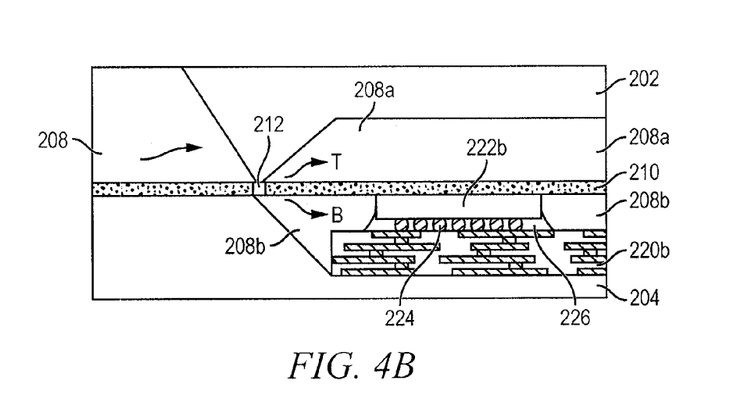

FIGS. 4A-4B are top plan and cross-sectional views of the dual-sided film-assist molding process of FIGS. 2A-2D. In this instance, the views show the membrane 210 over only a bottom substrate 220 for the sake of simplicity. As shown, the slot 212 can be formed off to one side of the membrane 210. In this example, the slot 212 sits substantially off to the side (e.g., left side) of the plurality of integrated circuit devices 222 as best illustrated in FIG. 4A. In operation, as the molding compound 208 prepares to flow into the packages 270 and reaches the slot 208, some portions will flow upward into the top cavity as indicated by the arrow T and become upper encapsulation 208a, while some portions will flow downward into the bottom cavity as indicated by the arrow B to provide lower encapsulation 208b. The directions of FIG. 4A should be better indicated as flowing "into the page" for arrow B and flowing "out of the page" for arrow T in view of FIG. 4B. The dual-sided film-assist molding process can be formed through the slot 212 within the membrane 210. The slot 212 also allows for better handling of the film rolling or passing of the film through the center of the pellet in facilitating the film-assist molding process as can be appreciated by one skilled in the art.

Figure 5:
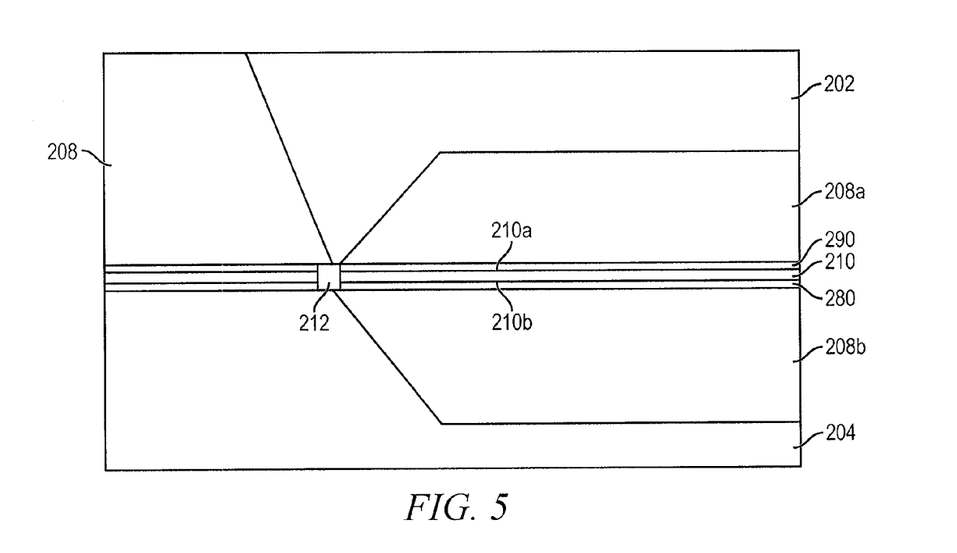
FIG. 5 is a cross-sectional view of a dual-sided film-assist molding process according to one embodiment of the present disclosure.

FIG. 5 is a cross-sectional view of a dual-sided film-assist molding process according to one embodiment of the present disclosure. This cross-sectional view is substantially similar to that of FIG. 4B with the exception that the membrane 210 is now surrounded by two films on opposite side of the membrane 210. In other words, the film or membrane 210 can now be embedded with additional metal layers or materials to provide a membrane 210 with metal embedded films.

In one embodiment, the first surface 210a of the membrane 210 can be contacted with a first film 290 while the second surface 210b of the membrane 210 can be contacted with a second film 280. The films 290, 280 can be metal-embedded types of films to help produce more flat and uniform molding structures during the molding process. The slot 212 can be formed through the membrane 210 as well as the films 290, 280 to carry out the dual-sided molding processes as described above. In operation, if the film-embedded membrane were to be incorporated into the process flow of FIGS. 2A-2D, the first cavity 218a created would be between the first film 290 and the first substrate 220a while the second cavity 218b created would be between the second film 280 and the second substrate 220b. In other words, the films 290, 280 would be applied on the surfaces 210a, 210b of the membrane to provide enhanced performance without substantially degrading or altering the dual-sided molding performance.

Figure 6:
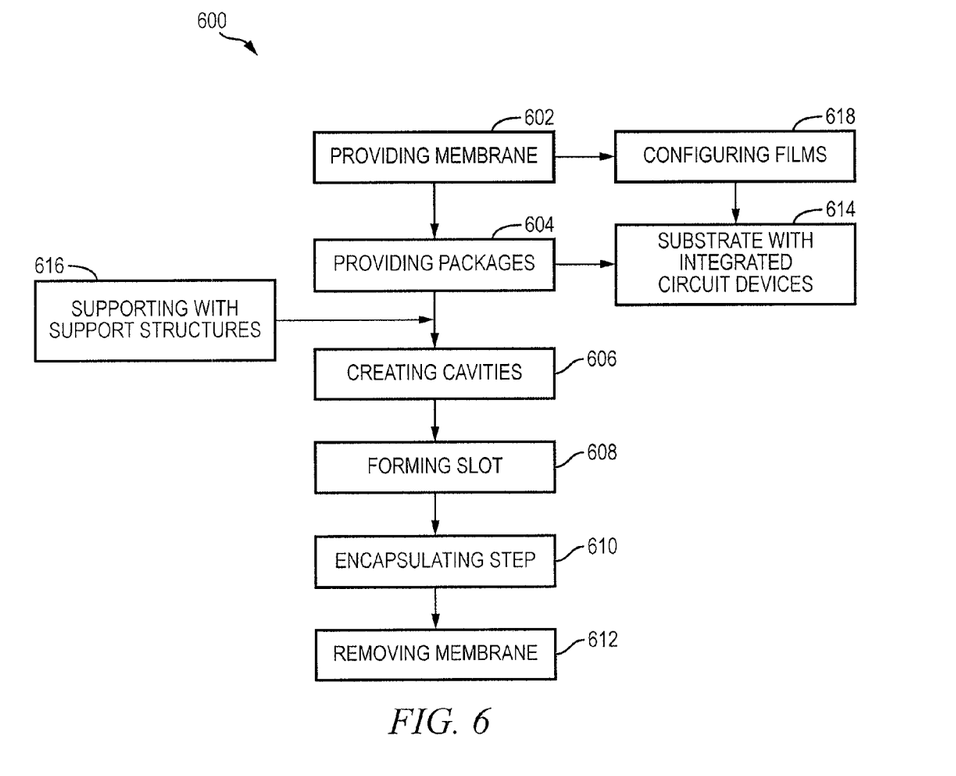
FIG. 6 is a flow diagram of the various process flows for forming a semiconductor package with dual-sided film-assist molding processes according to multiple embodiments of the present disclosure.

FIG. 6 is a flow diagram of the various process flows 600 for forming a semiconductor package with dual-sided film-assist molding processes according to multiple embodiments of the present disclosure. In one embodiment, a dual-sided film-assist molding process begins with step 602 of providing a membrane having a first surface and a second surface, the second surface being opposite the first surface. Next, step 604 includes providing a first package having a first substrate and a second package having a second substrate. Step 606 involves creating cavities with a first cavity created between the first surface of the membrane and the first substrate of the first package, and a second cavity created between the second surface of the membrane and the second substrate of the second package.

Next, step 608 includes forming a slot in the membrane such that the slot extends from the first surface to the second surface through the membrane. Subsequently, step 610 involves forming, concomitantly, an encapsulation on the first package and on the second package by introducing the encapsulation through the slot to simultaneously encapsulate the first cavity and the second cavity.

In one embodiment, the method further includes step 612 of removing the membrane to produce the first package and the second package, each package having the same encapsulation resulting from the simultaneous forming step 610. In another embodiment, the providing step 604 includes providing the first package having a first integrated circuit device mounted on the first substrate as indicated in step 614. In this embodiment, the cavities created in step 606 can be formed by contacting the first surface of the membrane to an upper surface of the first integrated circuit device such that the first cavity is adjacent the first integrated circuit device. In yet another embodiment, the providing 604 includes providing the second package having a second integrated circuit device mounted on the second substrate as indicated in step 614. In this embodiment, the cavities created in step 606 can be formed by contacting the second surface of the membrane to an upper surface of the second integrated circuit device such that the second cavity is adjacent the second integrated circuit device.

In one embodiment, before the creating step of 606 and after the providing step of step 604, includes step 616 of supporting the first package with a first support structure contacting the first substrate of the first package. In one embodiment, the first support structure can be a mold chase (e.g., top mold chase). Similarly, in another embodiment, also before the creating step of 606 and after the providing step of step 604, includes step 616 of supporting the second package with a second support structure contacting the second substrate of the second package. In one embodiment, the second support structure can also be a mold chase (e.g., bottom mold chase).

In one embodiment, the providing step of 602 further includes configuring a first film on the first surface of the membrane and a second film on the second surface of the membrane such that during the creating step of 606, the first cavity can be created between the first film and the first substrate and the second cavity can be created between the second film and the second substrate.

In one embodiment, a dual-sided film-assist molding process begins with step 602 of providing a membrane having a first surface and a second surface, the second surface being opposite the first surface. Next, step 604 can be combined with step 614 in providing a first package having a first substrate and a first integrated circuit device mounted thereon, along with a second package having a second substrate and a second integrated circuit device mounted thereon.

Step 606 involves creating cavities by contacting the first surface of the membrane to an upper surface of the first integrated circuit device of the first package to create a first cavity between the first surface of the membrane and the first substrate of the first package adjacent the first integrated circuit device. The step also includes contacting the second surface of the membrane to an upper surface of the second integrated circuit device of the second package to create a second cavity between the second surface of the membrane and the second substrate of the second package adjacent the second integrated circuit device.

Next, step 608 involves forming a slot in the membrane such that the slot extends from the first surface to the second surface through the membrane. Subsequently, step 610 involves forming, concomitantly, an encapsulation on the first package and on the second package by introducing the encapsulation through the slot to simultaneously encapsulate the first cavity and the second cavity. In one embodiment, the method further includes step 612 of removing the membrane to produce the first package and the second package, each package having the same encapsulation resulting from the simultaneous forming step 610.

In one embodiment, before the creating step of 606 and after the providing step of step 604, includes step 616 of supporting the first package with a first support structure contacting the first substrate of the first package. In one embodiment, the first support structure can be a mold chase (e.g., top mold chase). Similarly, in another embodiment, also before the creating step of 606 and after the providing step of step 604, includes step 616 of supporting the second package with a second support structure contacting the second substrate of the second package. In one embodiment, the second support structure can also be a mold chase (e.g., bottom mold chase).

In one embodiment, step 602 can be combined with step 618 such that the providing step of 602 further includes configuring a first film on the first surface of the membrane and a second film on the second surface of the membrane. Doing so can result in the creating step 606 to include contacting the first film on the first surface of the membrane to the upper surface of the first integrated circuit device of the first package and contacting the second film on the second surface of the membrane to the upper surface of the second integrated circuit device of the second package. In this embodiment, the contacting step creates the first cavity between the first film and the first substrate, the first cavity adjacent the first integrated circuit device. The contacting step further creates the second cavity between the second film and the second substrate, the second cavity adjacent the second integrated circuit device.

In one embodiment, a dual-sided film-assist molding process begins with a combination of step 620 and 618 providing a membrane having a first surface and a second surface opposite the first surface, the first surface having a first film mounted thereon and the second surface having a second film mounted thereon. Next, step 604 includes providing a first package having a first substrate and a second package having a second substrate. Optionally, step 604 can be combined with step 614 in providing a first package having a first substrate and a first integrated circuit device mounted thereon, along with a second package having a second substrate and a second integrated circuit device mounted thereon.

Step 606 involves creating cavities by creating a first cavity between the first surface of the membrane and the first substrate of the first package, and creating a second cavity between the second surface of the membrane and the second substrate of the second package. Next, step 608 involves forming a slot in the membrane such that the slot extends from the first surface to the second surface through the membrane. Subsequently, step 610 involves forming, concomitantly, an encapsulation on the first package and on the second package by introducing the encapsulation through the slot to simultaneously encapsulate the first cavity and the second cavity. In this embodiment, the method further includes step 612 of removing the membrane to produce the first package and the second package, each package having the same encapsulation resulting from the simultaneous forming step 610.

In another embodiment, the providing step 604 includes providing the first package having a first integrated circuit device mounted on the first substrate as indicated in step 614. In this embodiment, the cavities created in step 606 can be formed by contacting the first film of the membrane to an upper surface of the first integrated circuit device such that the first cavity is adjacent the first integrated circuit device. In yet another embodiment, the providing 604 includes providing the second package having a second integrated circuit device mounted on the second substrate as indicated in step 614. In this embodiment, the cavities created in step 606 can be formed by contacting the second film of the membrane to an upper surface of the second integrated circuit device such that the second cavity is adjacent the second integrated circuit device.

In one embodiment, before the creating step of 606 and after the providing step of step 604, includes step 616 of supporting the first package with a first support structure contacting the first substrate of the first package. In one embodiment, the first support structure can be a mold chase (e.g., top mold chase). Similarly, in another embodiment, also before the creating step of 606 and after the providing step of step 604, includes step 616 of supporting the second package with a second support structure contacting the second substrate of the second package. In one embodiment, the second support structure can also be a mold chase (e.g., bottom mold chase).

Although the current description has been described in detail with reference to several embodiments, additional variations and modifications exist within the scope and spirit of the disclosure.

What is claimed is:

1. A method comprising:
    (a) providing a membrane having a first surface and a second surface opposite the first surface;
    (b) providing a first package having a first substrate and a second package having a second substrate;
    (c) creating a first cavity between the first surface and the first substrate, and creating a second cavity between the second surface and the second substrate;
    (d) forming a slot in the membrane, the slot extending from the first surface to the second surface through the membrane; and
    (e) forming, concomitantly, an encapsulation on the first package and on the second package by introducing the encapsulation through the slot to simultaneously encapsulate the first cavity and the second cavity.

2. The method of claim 1, further comprising:
    (f) removing the membrane to produce the first package and the second package each having the same encapsulation resulting from the simultaneous forming step (e).

3. The method of claim 1, wherein the providing step (b) includes providing the first package having a first integrated circuit device mounted on the first substrate, and wherein the creating step (c) further includes contacting the first surface to an upper surface of the first integrated circuit device such that the first cavity is adjacent the first integrated circuit device.

4. The method of claim 1, wherein the providing step (b) includes providing the second package having a second integrated circuit device mounted on the second substrate, and wherein the creating step (c) further includes contacting the second surface to an upper surface of the second integrated circuit device such that the second cavity is adjacent the second integrated circuit device.

5. The method of claim 1, wherein before the creating step (c) and after the providing step (b), further includes supporting the first package with a first support structure contacting the first substrate.

6. The method of claim 1, wherein before the creating step (c) and after the providing step (b), further includes supporting the second package with a second support structure contacting the second substrate.

7. The method of claim 1, wherein the providing step (a) further includes:
configuring a first film on the first surface of the membrane and a second film on the second surface of the membrane such that during the creating step (c), the first cavity is created between the first film and the first substrate and the second cavity is created between the second film and the second substrate.

8. A method comprising:
(a) providing a membrane having a first surface and a second surface opposite the first surface;
(b) providing a first package having a first substrate and a first integrated circuit device mounted thereon, and a second package having a second substrate and a second integrated circuit device mounted thereon;
(c) contacting the first surface to an upper surface of the first integrated circuit device to create a first cavity between the first surface and the first substrate adjacent the first integrated circuit device, and contacting the second surface to an upper surface of the second integrated circuit device to create a second cavity between the second surface and the second substrate adjacent the second integrated circuit device;
(d) forming a slot in the membrane, the slot extending from the first surface to the second surface through the membrane; and
(e) forming, concomitantly, an encapsulation on the first package and on the second package by introducing the encapsulation through the slot to simultaneously encapsulate the first cavity and the second cavity.

9. The method of claim 8, further comprising:
(f) removing the membrane to produce the first package and the second package each having the same encapsulation resulting from the simultaneous forming step (e).

10. The method of claim 8, wherein before the contacting step (c) and after the providing step (b), further includes supporting the first package with a first support structure contacting the first substrate.

11. The method of claim 8, wherein before the contacting step (c) and after the providing step (b), further includes supporting the second package with a second support structure contacting the second substrate.

12. The method of claim 8, wherein the providing step (a) further includes:
configuring a first film on the first surface of the membrane and a second film on the second surface of the membrane such that the contacting step (c) further includes contacting the first film on the first surface to the upper surface of the first integrated circuit device and contacting the second film on the second surface to the upper surface of the second integrated circuit device.

13. The method of claim 12, wherein the contacting step (c) includes contacting the first film on the first surface to the upper surface of the first integrated circuit device to create the first cavity between the first film and the first substrate, the first cavity adjacent the first integrated circuit device, and contacting the second film on the second surface to the upper surface of the second integrated circuit device to create the second cavity between the second film and the second substrate, the second cavity adjacent the second integrated circuit device.

14. A method comprising:
(a) providing a membrane having a first surface and a second surface opposite the first surface, the first surface having a first film mounted thereon and the second surface having a second film mounted thereon;
(b) providing a first package having a first substrate and a second package having a second substrate;
(c) creating a first cavity by contacting the first film to the first package, and creating a second cavity by contacting the second film to the second package;
(d) forming a slot in the membrane, the slot extending from the first surface to the second surface through the membrane;
(e) forming, concomitantly, an encapsulation on the first package and on the second package by introducing the encapsulation through the slot to simultaneously encapsulate the first cavity and the second cavity; and
(f) removing the membrane to produce the first package and the second package each having the same encapsulation resulting from the simultaneous forming step (e).

15. The method of claim 14, wherein the providing step (b) includes providing the first package having a first integrated circuit device mounted on the first substrate, and wherein the creating step (c) further includes contacting the first film to an upper surface of the first integrated circuit device such that the first cavity is adjacent the first integrated circuit device.

16. The method of claim 14, wherein the providing step (b) includes providing the second package having a second integrated circuit device mounted on the second substrate, and wherein the creating step (c) further includes contacting the second film to an upper surface of the second integrated circuit device such that the second cavity is adjacent the second integrated circuit device.

17. The method of claim 14, wherein before the creating step (c) and after the providing step (b), further includes supporting the first package with a first support structure contacting the first substrate.

18. The method of claim 14, wherein before the creating step (c) and after the providing step (b), further includes supporting the second package with a second support structure contacting the second substrate.

* * * * *